United States Patent
Wong

[11] Patent Number: 5,215,801
[45] Date of Patent: Jun. 1, 1993

[54] SILICONE RESIN ELECTRONIC DEVICE ENCAPSULANT

[75] Inventor: Ching-Ping Wong, Lawrenceville, N.J.

[73] Assignee: AT&T Bell Laboratories, Murray Hill, N.J.

[21] Appl. No.: 726,416

[22] Filed: Jul. 5, 1991

Related U.S. Application Data

[63] Continuation-in-part of Ser. No. 569,799, Aug. 22, 1990, abandoned.

[51] Int. Cl.$^5$ .............................................. C23C 26/00
[52] U.S. Cl. .................................... 428/76; 427/96; 427/376.2
[58] Field of Search .................. 427/96, 376.2; 428/76

[56] References Cited

U.S. PATENT DOCUMENTS

| | | | |
|---|---|---|---|
| 4,059,708 | 11/1977 | Heiss | 427/96 |
| 4,118,595 | 10/1978 | Pfahnl | 427/96 |
| 4,163,072 | 7/1979 | Soos | 427/96 |
| 4,278,784 | 7/1981 | Wong | 427/96 |
| 4,318,939 | 3/1982 | Wong | 427/96 |
| 4,366,187 | 12/1982 | Gabriel | 427/96 |
| 4,508,758 | 4/1985 | Wong | 427/96 |
| 4,564,562 | 1/1986 | Wong | 427/96 |
| 4,720,431 | 1/1988 | Wong | 427/58 |
| 4,888,226 | 12/1989 | Wong | 428/76 |
| 5,051,275 | 9/1991 | Wong | 427/96 |
| 5,085,913 | 2/1992 | Wong | 427/96 |

OTHER PUBLICATIONS

"Electrical Performance and Reaction Kinetics of Silicone Gels," by C. P. Wong, Journal of Material Research, vol. 5, No. 4, Apr. 1990, pp. 795–800.

"Understanding the Use of Silicone Gels for Nonhermetic Plastic Packaging," by C. P. Wong et al., IEEE Transactions on Components, Hybrids, and Manufacturing Technology, vol. 12, No. 4, Dec. 1989, pp. 421–425.

"Monolithic High Voltage Gated Iode Crosspoint Array IC," by H. T. Weston et al., International Electron Devices Meeting Technical Digest, 1982, pp. 85–88.

Primary Examiner—Shrive Beck
Assistant Examiner—Vi Duong Dang
Attorney, Agent, or Firm—R. B. Anderson

[57] ABSTRACT

An electronic device (12) is encapsulated by a curable material (15) which, prior to cure, comprises sixteen to twenty-three weight percent of a silicone resin, forty-six to seventy-three weight percent of silicon dioxide, four to fifteen weight percent of silicon hydride, and six to twenty-five weight percent of xylene. The silicone resin is selected from the group consisting of polydimethylsiloxane, polymethylphenylsiloxane, and a mixture of polydimethylsiloxane and polymethylphenylsiloxane. The silicone resin contains a platinum catalyst and has vinyl and/or hydride functional components.

8 Claims, 1 Drawing Sheet

SILICONE RESIN ELECTRONIC DEVICE ENCAPSULANT

This is a continuation-in-part of C. P. Wong Case 37, Ser. No. 569,799 filed Aug. 22, 1990 now abandoned.

TECHNICAL FIELD

This invention relates to electronic devices which are encapsulated by a polymeric encapsulant, and, more particularly, to such devices which are encapsulated by a silicone resin.

BACKGROUND OF THE INVENTION

Silicone resins have been used for a number of purposes because of their thermal stability, dielectric properties, chemical stability and resistance to atmospheric deterioration. The recently published papers, "Electrical Performance and Reaction Kinetics of Silicone Gels," C. P. Wong, *Journal of Material Research*, Vol. 5, No. 4, April 1990, pp. 795–800, and, "Understanding the Use of Silicone Gels for Nonhermetic Plastic Packaging," C. P. Wong et al., *IEEE Transactions on Components, Hybrids, and Manufacturing Technology*, Vol. 12, No. 4, December 1989, pp. 421–425, describe the use of silicone resins as encapsulants for electronic devices, particularly integrated circuits.

The patent of Wong, U.S. Pat. No. 4,888,226, granted Dec. 19, 1989, is directed to a silicone resin that is particularly suitable for wire bonded hybrid integrated circuits. A hybrid integrated circuit is one in which a semiconductor chip, usually a silicon chip, is connected to a bonding pad region of a circuit pattern on a ceramic substrate. However, subsequent studies have indicated that, with ever higher requirements on the dependability of integrated circuits, the formulations of the Wong patent are still not as reliable as is desired. Particularly under extreme conditions of temperature and humidity, and with high integrated circuit bias voltages, failures of complex integrated circuits may still occur. With certain complex and high bias circuits, more protection is required since only a small amount of corrosion of a conductor can cause a failure of such circuits. There is therefore a continuing need for integrated circuit encapsulants that give a higher degree of protection from outside contaminants, particularly under conditions of high temperature and humidity, together with high voltage or current conduction in the encapsulated integrated circuit.

SUMMARY OF THE INVENTION

In accordance with the invention, an electronic device is encapsulated by a curable material which, prior to cure, comprises sixteen to twenty-three weight percent of a silicone resin, forty-six to seventy-three weight percent of silicon dioxide, four to fifteen weight percent of silicon hydride, and six to twenty-five weight percent of xylene. The silicone resin is selected from the group consisting of polydimethylsiloxane, polymethylphenylsiloxane, and a mixture of polydimethylsiloxane and polymethylphenylsiloxane. The silicone resin contains a platinum catalyst and has vinyl and/or hydride functional components. The mixture in accordance with the invention has an appropriate viscosity for application by flow coating, adheres well to metal, ceramic, silicon and other components of a hybrid integrated circuit and is durable. It protects an encapsulated electronic device from external contaminants such as water vapor under conditions of high temperature and high humidity, and high electrical bias voltage and current conduction by the electronic device.

These and other objects and advantages of the invention will be better understood from a consideration of the following detailed description, taken in conjunction with the accompanying drawings.

DETAILED DESCRIPTION

Figure 1:
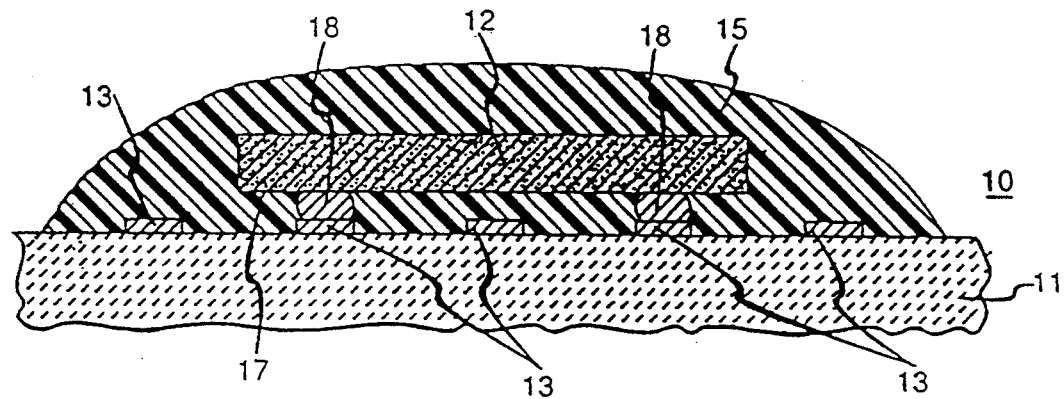
FIG. 1 is a sectional view of an encapsulated electronic device made in accordance with an illustrative embodiment of the invention.

Referring now to FIG. 1, there is shown schematically a hybrid integrated circuit 10 comprising a ceramic substrate 11 upon which is mounted an electronic device 12, which may be an integrated circuit known as a GDX or gated diode crosspoint switch device. The GDX is described, for example, in the paper, "Monolithic High Voltage Gated Diode Crosspoint Array IC," H. T. Weston et al., *IEDM Technical Digest (International Electronics Device Meeting)*, San Francisco, Calif., December 1982, hereby incorporated herein by reference. Defined on the upper surface of the substrate is a conductor pattern comprising conductors 13 connected to the electronic device 12. Overlying a major part of the conductors and the electronic device 12 is a silicone resin encapsulant 15. It is intended that the encapsulant cover the silicon device 12 and part of the conductor pattern on the surface of the ceramic substrate and protect them from atmospheric contaminants, while leaving exposed portions of the conductor pattern so that conductive bonds can be made to them for wiring the hybrid integrated circuit 10 to an external electronic system. The electronic device 12 is illustratively mounted by the "flip-chip" technique in which the surface 17 containing device interconnections faces the upper surface of ceramic substrate 11 and is bonded to the substrate by solder elements 18. With this kind of structure, it is particularly important that thte encapsulant fill the gap between the substrate 11 and device 12 and that surface 17 be protected from atmospheric contaminants.

In accordance with the invention, the encapsulant 15 is a curable material which, prior to cure, comprises sixteen to twenty-three weight percent of a silicone resin, forty-six to seventy-three weight percent of silicon dioxide, four to fifteen weight percent of silicon hydride and six to twenty-five weight percent of xylene. The silicone resin is selected from the group consisting of polydimethylsiloxane, polymethylphenylsiloxane, and a mixture of polydimethylsiloxane and polymethylphenylsiloxane. The silicone resin contains a platinum catalyst and has vinyl and/or hydride functional components. The silicon dioxide, which acts as a filler, is preferably powdered fused silica with a small amount of fumed silica. The silicon dioxide improves the encapsulant solvent resistance and its adhesion properties, particularly to the metal conductors which may be copper, gold, titanium or other metals. The uncured resin composition is sufficiently fluid to be coated by the known process of flow coating; that is, it is sufficiently viscous that gravity will cause it to flow about the device 12 after it has been dispensed on the device. After application, it is cured for one hour at room temperature, then one hour at one hundred degrees Centigrade, then for three hours at one hundred seventy-five degrees Centigrade. Variations can be made in the time and temperature for cure, but at least one step should include heating at a temperature of between one and two hundred degrees Centigrade for one to four hours.

Table I shows six different compositions, designated Ex (for example) 1 through Ex 6, that were made in accordance with the invention, tested, and found to have satisfactory characteristics. All were cured for one hour at room temperature, one hour at one hundred degrees Centigrade, and then at one hundred seventy-five degrees Centigrade for three hours. The silicone resin was in all cases DC3-4939, a polydimethylsiloxane and polymethylphenylsiloxane silicone resin commercially available from the Dow Chemical Company of Midland, Mich., which contains a small amount of platinum catalyst in addition to the silicone. More specifically, the DC3-4939 is designated "A" or "B," the A designating a resin terminated with a vinyl functional group and the B designating a resin terminated with a hydride functional group. In both cases, the resin is about eighty percent polydimethylsiloxane and about twenty percent polymethylphenylsiloxane. In all cases, the silicone resin portion consisted of fifty percent A resin and fifty percent B resin; although any of various mixtures of A and B resin could alternative be used. The silica (silicon dioxide) was a mixture of silica commercially available as "A10" and "V10" silica, which have grains about a few microns in diameter.

device greatly aggravates corrosion problems that may occur through the penetration of water vapor and other contaminants from the atmosphere onto the electronic device. Curve 20 illustrates test results for the silicone encapsulant of the aforementioned Wong patent. Curve 22 is a curve that consolidates the test results of the six examples of Table I. One can see that with the invention, there were no failures after six hundred hours of operations under the conditions mentioned. After less than four hundred hours, more than seventy-five percent of the devices encapsulated with the material of the Wong application had failed. This demonstrates that under conditions of severe temperature, humidity and extremely high electronic device voltage and current, the encapsulant materials of Table I are superior to that of the Wong patent.

It is believed that the reason for the superior operation of encapsulants of the present invention is that it has a greater capacity to wet and to adhere to all of the substrate surface and device surfaces which it touches. Specifically, the passivation layer, particularly of surface 17, of electronic device 18 is not completely free of pinholes or cracks; also the upper surface of ceramic substrate 11 is not perfectly smooth but contains microscopic ridges and indentations. It is believed that the use of xylene as a liquid carrier for the materials of Table I increases the capacity of the mixture to wet and seal to the device surfaces including surface 17 and to seal to the substrate even at the microscopic level. As a consequence, there is less likelihood of peeling and also less likelihood of the formation of microscopic channels along the interfaces of the encapsulant with the device

TABLE I

| Compositions | Ex 1 | | Ex 2 | | Ex 3 | | Ex 4 | | Ex 5 | | Ex 6 | |
|---|---|---|---|---|---|---|---|---|---|---|---|---|
| | grm | wt % | grm | wt % | grm | wt % | grm | wt % | grm | wt % | grm | wt % |
| Silicone Resin | 100 | 22.57 | 100 | 20.49 | 100 | 18.21 | 50 | 16.23 | 100 | 19.69 | 100 | 16.92 |
| Fused Silica | 205 | 46.28 | 250 | 51.23 | 328 | 59.74 | 150 | 48.70 | 328 | 64.57 | 425 | 71.91 |
| Fumed Silica | 2 | 0.45 | 2 | 0.41 | 2 | 0.36 | 2 | 1.65 | 2 | 0.39 | 2 | 0.34 |
| Total Silica | 207 | 46.73 | 252 | 51.64 | 330 | 60.10 | 152 | 50.35 | 330 | 64.96 | 427 | 72.25 |
| Silicon Hydride | 60 | 13.54 | 60 | 12.30 | 80 | 14.57 | 30 | 9.74 | 20 | 3.94 | 25 | 4.23 |
| Methacrylate-trimethyoxysilane | 2 | 0.45 | 2 | 0.41 | 2 | 0.36 | 2 | 0.65 | 2 | 0.39 | 2 | 0.34 |
| Xylene | 74 | 16.70 | 74 | 15.16 | 37 | 6.74 | 74 | 24.03 | 56 | 11.02 | 37 | 6.26 |

The mixture of Example 1 of Table I consisted of one hundred grams of silicone resin, which constituted 22.57 weight percent of the total mixture, two hundred seven grams of silica, which constituted 46.73 weight percent, sixty grams of silicon hydride, which constituteed 13.54 weight percent, two grams of methacrylate-trimethyoxysilane, which constituted 0.45 weight percent and seventy-four grams of xylene, which constituted 16.70 weight percent of the final mixture. In the six examples, one can see that the range of xylene was from 6.26 weight percent to 24.03 weight percent.

Figure 2:
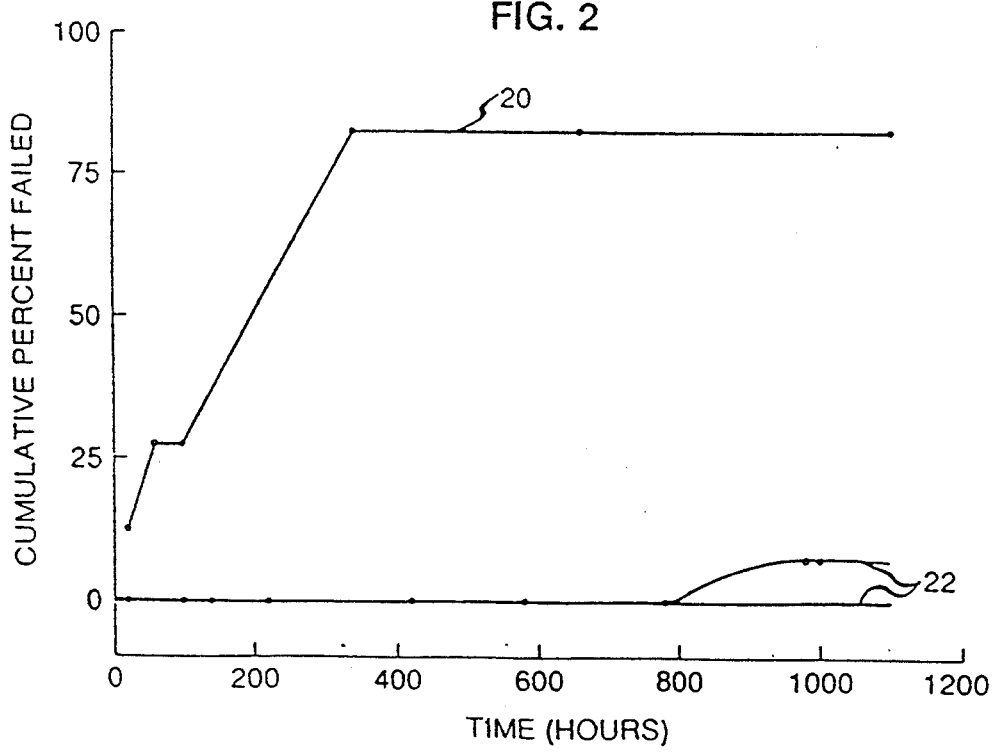
FIG. 2 is a graph comparing the failure rates of electronic devices encapsulated in accordance with the invention with electronic devices encapsulated with other materials.

FIG. 2 compares the encapsulants of Table I with an encapsulant made by the formulation described in the aforementioned Wong patent, U.S. Pat. No. 4,888,226. In all cases, the encapsulant was used to encapsulate an electronic device known as a gated diode crosspoint switch encapsulated as shown in FIG. 1. The gated diode crosspoint switch is a form of integrated circuit which requires an unusually high voltage for its operation. The curves all measure the failure rate of such devices as a function of time in an atmosphere of eighty-five percent relative humidity, eighty-five degrees Centigrade with the electronic device biased at a voltage of three hundred seventy-five volts. The high voltage and correspondingly high current through the electronic or substrate that may not be visible to the naked eye. Consequently, water vapor from the atmosphere cannot reach electronic device 12 and there is no corrosion of delicate conductors biased at high voltage.

The small amount of methyacrylate-trimethyoxysilane that was used in Examples one through six did not have a significant effect on the results shown in FIG. 2. In fact, this material was used as an additive to the material that is represented by curve 20. The use of this additive in the extremely small proportions shown in Table I is recommended and preferred, but not essential for the operation of the encapsulant.

Another consequence of applicant's formulation is that it is sufficiently viscous to be flow coatable. Flow coating is a method known in the art in which the material is deposited and allowed to coat an object through gravity flow. For some devices, flow coating is preferred to such methods as screen printing for depositing the uncured silicone resin onto the electronic device. The copending application of C. P. Wong, Ser. No. 434,052, is directed to a formulation that obtains the advantages of the Wong patent but additionally is appropriately viscous to be screen printable. The formulation of the Wong application contains a high boiling point solvent which makes setting and curring inordinately long (and/or the cure temperature inordinately high) if the coating is to be of an appropriate thickness to insulate a high voltage device. Flow coating in accordance with the invention yields a thickness of resin encapsulation of seventy-five to one hundred fifty microns, whereas the maximum practical thickness for the formulation of the Wong application is only ten to twenty-five microns. Recent studies indicate the two can beneficially be used together; screen printing with the resin of the Wong application can be used for covering the major part of the conductor pattern comprising conductors 13 of FIG. 1, while flow coating in accordance with the present invention is used for encapsulating GDX device 12 with an appropriately thicker insulating resin.

Various embodiments that have been described are intended to be merely descriptive of particular embodiments of the invention. Other modifications and embodiments may be made by those skilled in the art without departing from the spirit and scope of the invention.

I claim:

1. A method for encapsulating an electronic device comprising the steps of:

making a mixture consisting essentially of sixteen to twenty-three weight percent of an uncured silicone resin, forty-six to seventy-three weight percent of silicon dioxide, four to fifteen weight percent of silicon hydride and six to twenty-five weight percent of xylene;

the silicon resin being selected from the group consisting of polydimethylsiloxane, polymethylphenylsiloxane, and a mixture of polydimethylsiloxane and polymethylphenylsiloxane;

the silicone resin containing a platinum catalyst and having functional components selected from the group consisting of vinyl and hydride functional components;

depositing the mixture over an electronic device;

and curing the mixture by heating it at an elevated temperature for a sufficient time to harden the mixture.

2. The method of claim 1 wherein:
   the silicon resin comprises approximately fifty weight percent of a first silicone resin having predominantly vinyl functional components, and approximately fifty weight percent of a second silicone resin have predominantly hydride functional components.

3. The method of claim 1 wherein:
   the mixture is cured by a cure process, at least one step of which includes heating at a temperature of between one hundred and two hundred degrees Centigrade for one to four hours.

4. The method of claim 1 wherein:
   the mixture is deposited by flow coating.

5. An article made by the method of claim 1.

6. The method of claim 1 wherein:
   the mixture is deposited so as to cover at least part of the electronic device to a thickness of between seventy-five and one hundred fifty microns.

7. The method of claim 6 wherein:
   the mixture is deposited by flow coating.

8. The method of claim 7 wherein:
   the curing step comprises heating at a temperature of between one hundred and two hundred degrees Centigrade for one to four hours.

* * * * *